US012648185B2

(12) United States Patent
Zhu et al.

(10) Patent No.: US 12,648,185 B2
(45) Date of Patent: Jun. 2, 2026

(54) THIN FILM TRANSISTOR ARRAY SUBSTRATE, DISPLAY PANEL AND DISPLAY DEVICE

(71) Applicant: KunShan Go-Visionox Opto-Electronics Co., Ltd, Kunshan (CN)

(72) Inventors: Zhengyong Zhu, Kunshan (CN); Xin Zhao, Kunshan (CN); Shuang Hu, Kunshan (CN); Zhili Ma, Kunshan (CN)

(73) Assignee: KunShan Go-Visionox Opto-Electronics Co., Ltd, Kunshan (CN)

( * ) Notice: Subject to any disclaimer, the term of this patent is extended or adjusted under 35 U.S.C. 154(b) by 483 days.

(21) Appl. No.: 17/831,987

(22) Filed: Jun. 3, 2022

(65) Prior Publication Data

US 2022/0302321 A1 Sep. 22, 2022

Related U.S. Application Data

(63) Continuation of application No. PCT/CN2021/088315, filed on Apr. 20, 2021.

(30) Foreign Application Priority Data

Jun. 22, 2020 (CN) .......................... 202010572184.4

(51) Int. Cl.
*H10D 30/67* (2025.01)
*H10D 30/01* (2025.01)
(Continued)

(52) U.S. Cl.
CPC ..... *H10D 30/6757* (2025.01); *H10D 30/0314* (2025.01); *H10D 30/0321* (2025.01); *H10D 86/421* (2025.01); *H10D 86/60* (2025.01)

(58) Field of Classification Search
CPC ........... H01L 29/78696; H01L 27/1222; H01L 29/66757; H01L 27/1214; H01L 27/1259;
(Continued)

(56) References Cited

U.S. PATENT DOCUMENTS

| | | | |
|---|---|---|---|
| 5,329,138 A * | 7/1994 | Mitani | H10D 84/038 |
| | | | 257/E29.255 |
| 6,180,957 B1 * | 1/2001 | Miyasaka | H10D 86/60 |
| | | | 257/353 |

(Continued)

FOREIGN PATENT DOCUMENTS

| | | |
|---|---|---|
| CN | 1540602 A | 10/2004 |
| CN | 104716200 A | 6/2015 |

(Continued)

OTHER PUBLICATIONS

Akito Hara and Kuninori Kitahara, Hydrogenation of Polycrystalline Silicon Thin-Film Transistors, Jan. 25, 2017, New Advantages in Hydrogenation Processes—Fundamentals and Applications (Year: 2017).*

(Continued)

*Primary Examiner* — Daniel Luke
(74) *Attorney, Agent, or Firm* — Maier & Maier, PLLC

(57) ABSTRACT

A thin film transistor array substrate, a display panel and a display device. The thin film transistor array substrate includes a semiconductor layer, a gate layer and a source-drain layer arranged in a stacked manner, two insulating layers respectively located between the semiconductor layer and the gate layer and between the gate layer and the source-drain layer, the semiconductor layer comprises a source region, a drain region and a channel region located between the source region and the drain region, the channel region is doped with a p-type impurity, a molecular weight of the p-type impurity in the channel region is equal to or (Continued)

greater than 25, a range of a doping depth of the p-type impurity in the channel region is 1 nm to 20 nm.

13 Claims, 4 Drawing Sheets

(51) Int. Cl.
    *H10D 86/40*      (2025.01)
    *H10D 86/60*      (2025.01)

(58) Field of Classification Search
    CPC .. H01L 27/127; H10K 59/12; H10K 59/1213;
                        H10D 30/6757
    See application file for complete search history.

(56) References Cited

U.S. PATENT DOCUMENTS

| | | | | |
|---|---|---|---|---|
| 6,429,083 | B1 * | 8/2002 | Ishida | H10D 64/021 |
| | | | | 438/303 |
| 9,768,312 | B2 * | 9/2017 | Tian | H01L 29/786 |
| 2004/0183132 | A1 | 9/2004 | Yamazaki et al. | |
| 2008/0293225 | A1 * | 11/2008 | Suguro | H01L 21/266 |
| | | | | 438/513 |
| 2013/0063329 | A1 * | 3/2013 | Saitoh | H10B 10/00 |
| | | | | 345/55 |
| 2016/0380113 | A1 | 12/2016 | Kang et al. | |
| 2017/0040464 | A1 * | 2/2017 | Tian | H01L 21/02592 |
| 2020/0161389 | A1 * | 5/2020 | Lee | H10K 59/12 |
| 2022/0216285 | A1 * | 7/2022 | Seo | H10D 30/6713 |

FOREIGN PATENT DOCUMENTS

| | | |
|---|---|---|
| CN | 110603657 A | 12/2019 |
| CN | 111653578 A | 9/2020 |

OTHER PUBLICATIONS

International Search Report (with English Translation) and Written Opinion mailed on Jul. 21, 2021, in corresponding International Application No. PCT/CN2021/088315, 11 pages.

First Office Action issued Aug. 23, 2021, corresponding to Chinese Application No. 202010572184.4, 12 pages (with English Translation).

The Rejection Decision issued Apr. 6, 2022, corresponding to Chinese Application No. 202010572184.4, 4 pages (with English Translation).

* cited by examiner

P-type impurities 20 (21)

THIN FILM TRANSISTOR ARRAY SUBSTRATE, DISPLAY PANEL AND DISPLAY DEVICE

CROSS-REFERENCE TO RELATED APPLICATIONS

This application is a continuation of International Application No. PCT/CN2021/088315, filed on Apr. 20, 2021, which claims priority to Chinese Patent Application No. 202010572184.4 filed on Jun. 22, 2020, all of which are hereby incorporated by reference in their entireties.

FIELD

The present application relates to the field of display, in particular to a thin film transistor array substrate, a display panel and a display device.

BACKGROUND

Organic light emitting diode (Organic Light Emitting Diode, OLED) display technology has the advantages of wide viewing angle, low driving voltage, fast response speed, rich luminous colors and large-area flexible display. The OLED display technology is one of the display technologies widely concerned at present. Active matrix organic light emitting diode (Active Matrix Organic Light Emitting Diode, AMOLED) display technology is a display technology originated from the OLED display technology. The AMOLED display technology has the characteristics of self-illumination, low power consumption and larger size. The AMOLED display technology has been highly valued in the field of display technology.

However, when the pixel circuits in different areas of the (AM) OLED display panel operate in different brightness pictures for a period of time and switch to the same gray scale, the brightness of different areas will be different, that is, the image has bad residual shadow, which seriously affects the visual effect.

SUMMARY

In order to solve the above technical problems, the present application provides a thin film transistor (Thin Film Transistor, TFT) array substrate, a display panel and a display device which can improve a phenomenon of residual shadow.

A first aspect of the present application provides a TFT array substrate comprising a semiconductor layer, a gate layer and a source-drain layer arranged in a stacked manner, two insulating layers respectively located between the semiconductor layer and the gate layer and between the gate layer and the source-drain layer. The semiconductor layer comprises a source region, a drain region and a channel region between the source region and the drain region, the channel region is doped with a p-type impurity, a molecular weight of the p-type impurity in the channel region is equal to or greater than 25 and a range of a doping depth of the p-type impurity in the channel region is 1 nm to 20 nm. The gate layer comprises a gate arranged corresponding to the channel region, the source-drain layer comprises a source and a drain separated from each other, the source is electrically connected to the source region, and the drain is electrically connected to the drain region.

A second aspect of the present application provides a display panel, which comprises a TFT array substrate as described in the first aspect of the present application.

A third aspect of the present application provides a display device comprising the display panel as described in the second aspect of the present application.

Surprisingly, it is found that the present application can make different TFTs in the TFT array substrate have high electrical consistency and stability by doping a p-type impurity with the molecular weight equal to or greater than 25 in the channel region of the semiconductor layer of the TFT array substrate and controlling the doping depth of the p-type impurity to range from 1 nm to 20 nm. Therefore, the TFT array substrate can effectively improve a phenomenon of residual shadow of the display panel and the display device, improve the uniformity of the display, and improve the display effect.

DETAILED DESCRIPTION

In order to make the invention purpose, technical scheme and beneficial technical effect of the present application clearer, the present application is further described in detail below in combination with embodiments. It should be understood that the embodiments described in this specification are only for the purpose of explaining the present application and are not intended to limit the present application.

Each TFT in the thin film transistor (TFT) array substrate may "actively" control each independent pixel of the (AM) OLED display device to achieve the purpose of display. It is found by the inventor that the uneven display of the (AM) OLED display device is largely caused by the difference of TFT characteristics of the TFT array substrate. For the uneven display (mura) caused by the uneven electrical properties of TFT caused by the process, it can be solved through the function of Demura, but Demura cannot improve the phenomenon of residual shadow in the display process.

The phenomenon of residual shadow (such as short-term residual shadow) of the (AM) OLED display device can be improved by optimizing the channel doping of TFT.

Therefore, the implementation of the first aspect of the present application provides a thin film transistor (TFT) which is a p-type channel TFT. The TFT array substrate comprises a semiconductor layer, a gate layer and a source-drain layer arranged in a stacked manner, two insulating layers respectively located between the semiconductor layer and the gate layer and between the gate layer and the source-drain layer. The semiconductor layer comprises a source region, a drain region and a channel region located between the source region and the drain region, the channel region is doped with a p-type impurity, a molecular weight of the p-type impurity in the channel region is greater than or equal to 25, and a range of a doping depth of the p-type impurity in the channel region is 1 nm to 20 nm. The gate layer comprises a gate arranged corresponding to the channel region, the source-drain layer comprises a source and a drain separated from each other, the source is electrically connected to the source region, and the drain is electrically connected to the drain region.

By doping p-type impurities with the molecular weight equal to or greater than 25 in the channel region of the semiconductor layer of TFT and controlling the doping depth of the p-type impurities to range from 1 nm to 20 nm, the TFT in the TFT array substrate may have high consistency and stability of electrical properties (such as threshold voltage, sub threshold swing, etc.). Therefore, the TFT array substrate may effectively improve the phenomenon of residual shadow of the display panel and the display device, improve the uniformity of the display, and improve the display effect.

Figure 1:
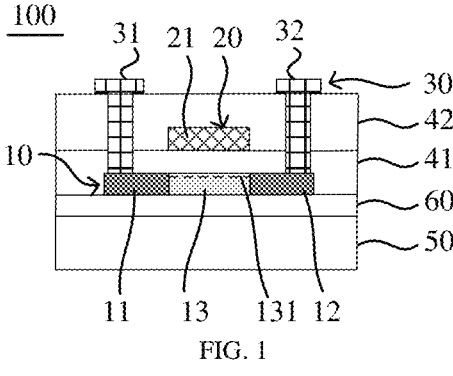
FIG. 1 is a structural diagram of a TFT array substrate provided by the embodiments of the present application.

In some implementations, the TFT may be a top gate TFT. FIG. 1 illustrates a top gate TFT 100 as an example. Referring to FIG. 1, the TFT 100 includes a semiconductor layer 10, a gate insulating layer 41, a gate layer 20, an internal insulating layer 42 and a source-drain layer 30 stacked in sequence. The semiconductor layer 10 includes a source region 11, a drain region 12, and a channel region 13 located between the source region 11 and the drain region 12. The channel region 13 is doped with a p-type impurity, a molecular weight of the p-type impurity in the channel region is equal to or greater than 25, and a range of a doping depth of the p-type impurity in the channel region is 1 nm to 20 nm. The gate layer 20 includes a gate 21, which is arranged corresponding to the channel region 13. The source-drain layer 30 includes a source 31 and a drain 32 separated from each other. The source 31 is electrically connected to the source region 11, and the drain 32 is electrically connected to the drain region 12.

In any implementation, the doping depth of the p-type impurity doped in the channel region 13 may be 2 nm to 18 nm, 3 nm to 15 nm, 4 nm to 12 nm, or 5 nm to 10 nm. By adjusting the doping depth of the p-type impurity doped in the channel region 13, the electrical consistency and stability of different TFTs may be effectively improved, so that the luminous brightness of the (AM) OLED is substantially the same as switching from different gray scales to the same gray scale, and the phenomenon of short-term residual shadow may be improved. A range of the thickness of the channel region 13 is, for example, 40 nm to 55 nm, and then, for example, 40 nm to 45 nm, or 45 nm to 55 nm; e.g. 45 nm.

It should be noted that the doping depth of the p-type impurity in the channel region 13 is 1 nm to 20 nm, and the p-type impurity is mainly doped in a surface layer 131 of the channel region 13. However, it does not exclude the existence of a small number of p-type impurities in a portion of the channel region 13 with a depth greater than 20 nm, but the content of p-type impurities in the portion of the channel region 13 with the depth greater than 20 nm is substantially close to an undoped state.

In any implementation, a range of a doping concentration of the p-type impurity of the channel region 13 may be $3 \times 10^{11}$ cm$^{-2}$ to $2 \times 10^{12}$ cm$^{-2}$, or $5 \times 10^{11}$ cm$^{-2}$ to $1 \times 10^{12}$ cm$^{-2}$. If the doping concentration of the p-type impurity in the channel region 13 is in an appropriate range, it can improve the electron transferring characteristics of TFT, improve the stability of TFT array substrate 100, improve the phenomenon of the short-term residual shadow and improve the display effect.

Ion implantation process is generally used for doping in the channel region 13. However, due to the limitation of the ion implantation equipment and the ion implantation process, the implantation depth of the common p-type impurity B (calculated by the peak concentration of B) is difficult to be effectively controlled. Even at a lower injection energy (10 keV), the implantation depth of B is still large (about 36 nm). The industry changes the doping of the channel region 13 to be carried out after the formation of the gate insulating layer 41, which can control the doping distribution (including the injection depth) of B in the polysilicon layer to a certain extent, but this will bring unavoidable damage to the gate insulating layer 41 and affect the display effect and device life.

In any implementation of the present application, in order to better control the doping distribution (including doping depth) of the p-type impurity in the channel region 13, the molecular weight of p-type impurity is equal to or greater than 25, equal to or greater than 29, or equal to or greater than 45. For example, the range of the molecular weight of the p-type impurity may be 25 to 200, 29 to 120, 29 to 85, or 45 to 50. As an example, the p-type impurity may be selected from one or more of indium, BF and BF$_2$, further selected from one or more of BF and BF$_2$, and further selected from BF$_2$.

The adoption of an appropriate p-type impurity is advantageous to control its doping distribution (e.g., doping depth) in the channel region 13. In particular, using the p-type impurity containing F for channel doping may form a more stable Si—F bond to repair Si dangling bond of the channel region 13, so as to further improve the stability of TFT and further improve the phenomenon of the short-term residual shadow.

In any implementation, the semiconductor layer 10 may include one or more of amorphous silicon (a-Si) and p-Si. Further, the semiconductor layer 10 may be a polysilicon film layer. Still further, the semiconductor layer 10 may be a low temperature polysilicon (LTPS) film layer. Using a suitable semiconductor layer 10 may improve the stability of TFT and improve the phenomenon of the short-term residual shadow of the display device.

In the TFT array substrate of the present application, when the semiconductor layer 10 is a polysilicon film layer, the stability of TFT may be further improved by controlling the particle size and hydrogen content of P—Si.

Alternatively, a range of the particle size of polysilicon in the polysilicon film layer is 0.2 μm to 0.4 μm, or 0.2 μm to 0.3 μm.

Alternatively, a range of the hydrogen content (atomic percentage) of the polysilicon film layer is 0.01% to 3%, 0.01% to 2%, 0.1% to 3%, 0.1% to 2%, or 0.05% to 1.5%.

In the TFT array substrate of the present application, the appropriate composition of the film layer is selected for the insulating layer (i.e. the gate insulating layer 41) between the semiconductor layer 10 and the gate layer 20, which is advantageous to improve the stability of the TFT. As an example, the gate insulating layer 41 may include one or more of silicon oxide, silicon nitride and silicon-based nitrogen oxide. Further, the gate insulating layer 41 includes silicon oxide, or the gate insulating layer 41 is a silicon oxide film layer.

In the TFT array substrate of the present application, the gate layer 20 may include a gate material known in the art. As an example, the gate layer 20 may include one or more of titanium, molybdenum, gold, platinum, aluminum, nickel, copper, and alloys from more than two of them. Further, the gate layer 20 may be a composite layer of more than two metal layers and/or alloy layers.

In the TFT array substrate of the present application, the source-drain layer 30 may include a gate material known in the art. As an example, the source-drain layer 30 may include one or more of titanium, molybdenum, gold, platinum, aluminum, nickel, copper, and alloys from more than two of them. Further, the source-drain layer 30 may be a composite layer of more than two metal layers and/or alloy layers.

In the TFT array substrate of the present application, the internal insulating layer 42 may include insulating materials known in the art. As an example, the internal insulating layer 42 may include one or more of silicon oxide, silicon nitride and silicon-based nitrogen oxide. Alternatively, the internal insulating layer 42 may be a composite layer including more than two of silicon oxide layer, silicon nitride layer and silicon-based nitrogen oxide layer.

Next, a method for manufacturing TFT array substrate is provided. The TFT array substrate may be manufactured according to this method. The method for manufacturing TFT array substrate may include a step S100 for forming a semiconductor layer, a step S200 for forming a gate layer, and a step S300 for forming a source-drain layer. The method for manufacturing TFT array substrate is described in detail below in combination with FIG. 2 to FIG. 8.

S100 includes: S110, forming an initial semiconductor layer 10' on the substrate 50. The substrate 50 may be a glass substrate. The initial semiconductor layer 10' may be a P—Si layer.

The step for forming the initial semiconductor layer 10' may be performed by using methods and devices known in the art. For example, an amorphous silicon layer may be obtained by plasma enhanced chemical vapor deposition (plasma enhanced chemical vapor deposition, PECVD); then dehydrogenation treatment is carried out under the conditions of 400° C. to 500° C. (such as 450° C.) to regulate the hydrogen content; then amorphous silicon was crystallized by excimer laser annealing (excimer laser annealing, ELA) to form a P—Si film; then the P—Si film is etched to form polysilicon pattern (e.g. adopt dry etching with photoresist as mask) to obtain a P—Si layer. Alternatively, the amorphous silicon layer may also be cleaned with HF and ozone before the ELA process. Surface particles can be removed by cleaning, and form SiO on the surface of amorphous silicon layer, which is advantageous to the subsequent ELA process.

Figure 2:
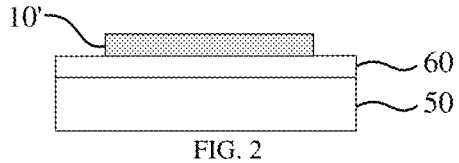
FIG. 2 is a step diagram of a preparation method of forming an initial semiconductor layer in a TFT array substrate provided by the embodiments of the present application.

In some implementations, a buffer layer 60 may also be formed on the substrate 50 before the initial semiconductor layer 10' is formed, and then the initial semiconductor layer 10' may be formed on the buffer layer 60. For example, as shown in FIG. 2. The buffer layer 60 may be a silicon oxide layer, a silicon nitride layer, or a composite layer of a silicon oxide layer and a silicon nitride layer. The buffer layer 60 may be formed by using methods and devices known in the art, for example, chemical vapor deposition (CVD) method, and PECVD method.

S100 also includes: S120, doping a p-type impurity into the initial semiconductor layer 10'.

Figure 3:
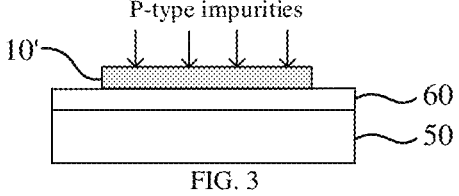
FIG. 3 is a step diagram of a preparation method of doping a p-type impurity in an initial semiconductor layer in a TFT array substrate provided by the embodiments of the present application.
Figure 4:
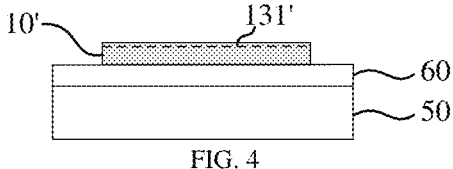
FIG. 4 is a step diagram of a preparation method of forming an initial semiconductor layer doped with a p-type impurity in a TFT array substrate provided by the embodiments of the present application.

At S120, a p-type impurity may be as described herein. The p-type impurity may be implanted into the initial semiconductor layer 10' by using an ion implantation process (as shown in FIG. 3). The energy of ion implantation may be 5 keV to 20 keV, or 8 keV to 15 keV, or 10 keV to 15 keV, or 10 keV to 12 keV. A range of the dose of the ion implantation may be $3 \times 10^{11}$ cm$^{-2}$ to $2 \times 10^{12}$ cm$^{-2}$, or $5 \times 10^{11}$ cm$^{-2}$ to $1 \times 10^{12}$ cm$^{-2}$. The gas source for ion implantation is BF$_3$, for example. In this application, the existing BF$_3$ may be used as gas source of the ion implantation, so it is only necessary to change the magnetic field of the ion implantation device to select the appropriate ions for implantation without increasing the process cost. S120, the p-type impurity is substantially doped in the surface layer 131' of the initial semiconductor layer 10' (as shown in FIG. 4). That is, S120 makes the p-type impurity mainly doped in the surface layer 131 in the channel region 13 of the semiconductor layer 10.

Next, the gate layer 20 is firstly formed, that is, S200 is performed.

S200 includes: S210, forming a gate insulating layer 41 on the initial semiconductor layer 10' doped with the p-type impurity. The gate insulating layer 41 may be formed by using methods and devices known in the art, for example, chemical vapor deposition (CVD) method, and PECVD method.

Figure 5:
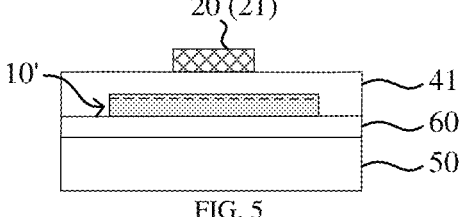
FIG. 5 is a step diagram of a preparation method of forming a gate layer in a TFT array substrate provided by the embodiments of the present application.

S200 also includes: S220, forming a gate layer 20. The gate film may be formed by using methods and devices known in the art, such as physical vapor deposition (physical vapor deposition, PVD) process, and further such as sputtering process. The gate film is then patterned to form a gate layer 20 (as shown in FIG. 5).

Alternatively, a cleaning step for the initial semiconductor layer 10' is also performed before S210. Specifically, ozone and HF may be used for cleaning to remove the oxide layer on the surface of the initial semiconductor layer 10' and planarize the initial semiconductor layer 10'.

Figure 6:
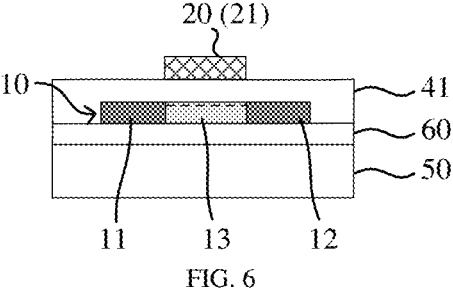
FIG. 6 is a step diagram of a preparation method of forming a semiconductor layer in a TFT array substrate provided by the embodiments of the present application.

Next, continue to complete the preparation for the semiconductor layer 10. That is, at S130, with the gate layer 20 as the mask, the p-type impurity is doped on both sides of the initial semiconductor layer 10' to form the source region 11 and the drain region 12 respectively to obtain the semiconductor layer 10 (as shown in FIG. 6). At S130, the p-type impurity may be selected from indium, B, BF$_2$, etc., such as B. The p-type impurity may be implanted into the initial semiconductor layer 10' by an ion implantation process. The dose of the ion implantation may be $5 \times 10^{14}$ cm$^{-2}$ to $2 \times 10^{15}$ cm$^{-2}$. A range of the energy of the ion implantation may be 10 keV to 40 keV. The gas source for the ion implantation is BF$_3$, for example.

Next, an internal insulating layer 42 is formed on the gate layer 20. The internal insulating layer 42 may be formed by using methods and devices known in the art, for example, chemical vapor deposition (CVD) method, and PECVD method.

Figure 7:
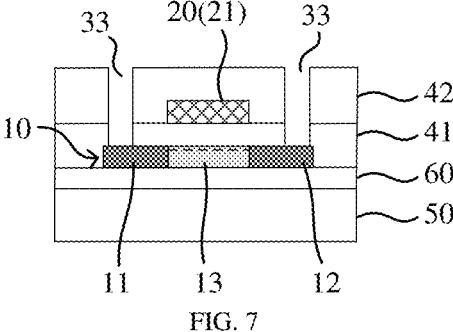
FIG. 7 is a step diagram of a preparation method of forming an internal insulating layer and a through hole in a TFT array substrate provided by the embodiments of the present application.

Then, a through hole 33 corresponding to the source region 11 and the drain region 12 is formed on the internal insulating layer 42 and the gate insulating layer 41 (as shown in FIG. 7). The through hole 33 may be formed by using methods and devices known in the art. For example, the through hole 33 is formed by dry etching with photoresist as a mask.

Figure 8:
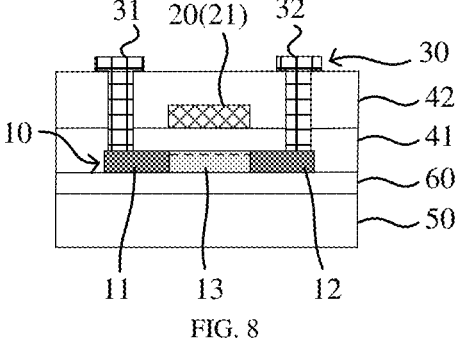
FIG. 8 is a step diagram of a preparation method of forming a source-drain layer in a TFT array substrate provided by the embodiments of the present application.

Next, the source-drain layer 30 is formed, that is, S300 is performed. The source drain film may be formed by using methods and devices known in the art, such as physical vapor deposition (PVD) process, and further such as sputtering process. The source drain film is extended into the through hole 33 and is electrically connected to the source region 11 and the drain region 12 respectively. Then, the source drain film is patterned to form the source-drain layer 30 (as shown in FIG. 8).

Figures 9, 10, 11:
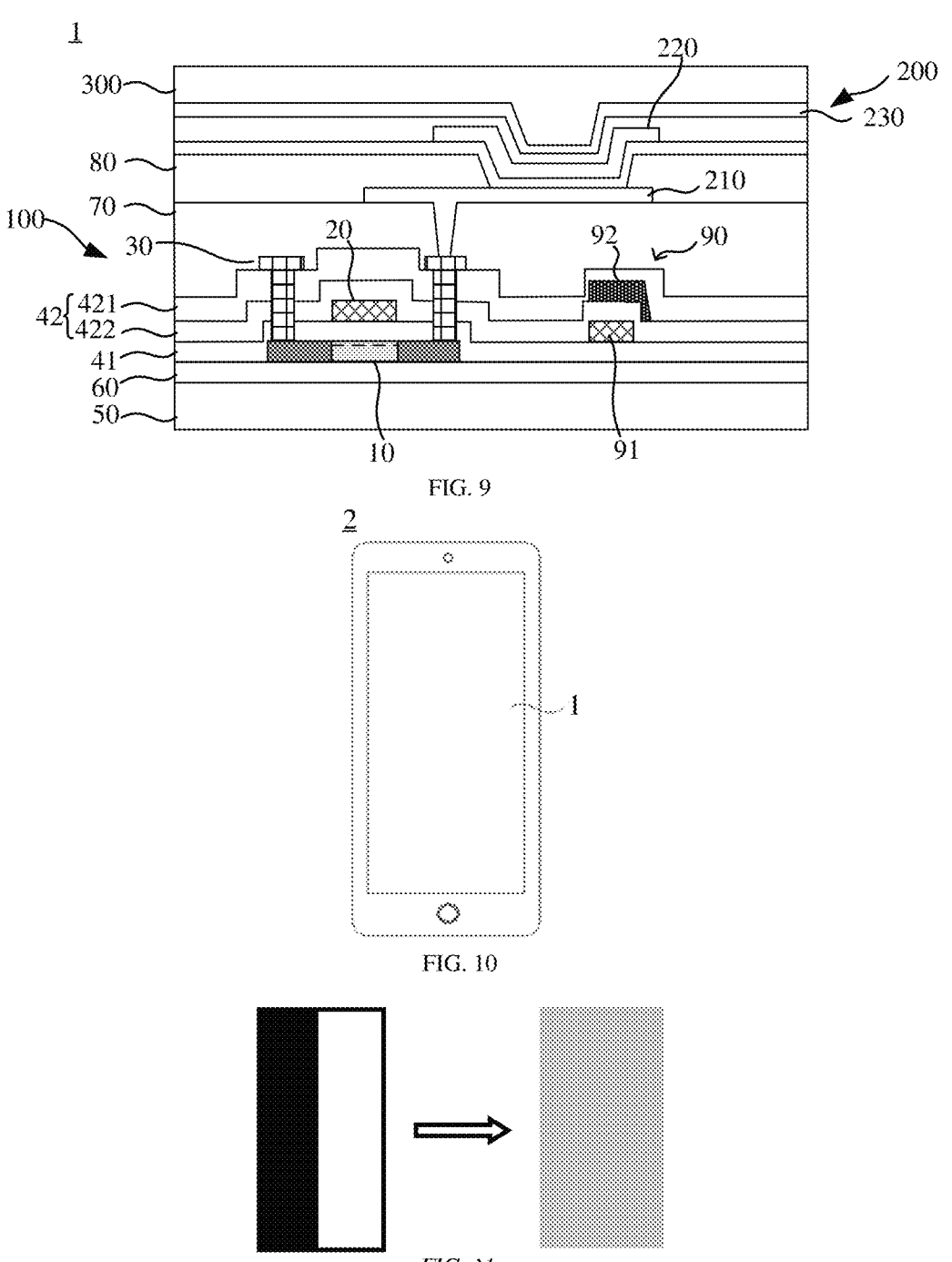
FIG. 9 is a structural diagram of a display panel provided by the embodiments of the present application.
FIG. 10 is a structural diagram of a display device provided by the embodiments of the present application.
FIG. 11 is a schematic diagram of the display effect of the display panel of an embodiment 1.

Alternatively, a planarized layer 70, an electrode layer and a pixel definition layer 80 may be further formed on the source-drain layer 30 in sequence (as shown in FIG. 9).

Alternatively, the TFT array substrate may further include a storage capacitor region 90. As shown in FIG. 9, the storage capacitance region 90 includes a first electrode 91 and a second electrode 92, wherein the first electrode 91 and the second electrode 92 are separated by a capacitive dielectric layer 422. As an example, the first electrode 91 and the second electrode 92 may respectively include one or more of titanium, molybdenum, gold, platinum, aluminum, nickel, copper, and alloys from more than two of them. The capacitive dielectric layer 422 may include one or more of silicon oxide, silicon nitride and silicon-based nitrogen oxide, such as silicon nitride.

Alternatively, the first electrode 91 may be placed on the gate layer 20. By patterning for the gate film, the first electrode 91 is formed while the gate 21 is obtained. The second electrode 92 may be formed by using the methods and devices known in the art. For example, the electrode film layer is formed by physical vapor deposition (physical vapor deposition, PVD) (e.g., sputtering), and then the electrode film layer is patterned to form the second electrode 92.

The internal insulating layer 42 may include an interlayer insulating layer 421 and a capacitive dielectric layer 422, wherein the interlayer insulating layer 421 and the capacitive dielectric layer 422 isolate the gate layer 20 from the source-drain layer 30, the capacitive dielectric layer 422 isolates the first electrode 91 from the second electrode 92, and the interlayer insulating layer 421 isolates the second electrode 92 from the source-drain layer 30. The interlayer insulating layer 421 may include one or more of silicon oxide, silicon nitride and silicon-based nitrogen oxide. Further, the interlayer insulating layer 421 may be a composite layer including more than two of silicon oxide layer, silicon nitride layer and silicon-based nitrogen oxide layer. The capacitive dielectric layer 422 may be as described above.

The technical features of the TFT array substrate of the present application are also applicable to the manufacturing method of the present application and will not be repeated here.

The present application also provides a display panel, which comprises any TFT array substrate of the present application.

The display panel of the present application adopts the TFT array substrate of the present application, so that the phenomenon of residual shadow is weak and the display uniformity is good.

FIG. 9 shows a display panel 1 as an example. Referring to FIG. 9, the display panel 1 includes a TFT array substrate 100, an organic light-emitting display module 200 located on the TFT array substrate 100, and a packaging layer 300 located on the organic light-emitting display module 200. The TFT array substrate 100 may be any TFT array substrate described herein.

The organic light-emitting display module 200 includes a first electrode layer 210, an organic thin film layer 220 and a second electrode layer 230, and the organic thin film layer 220 includes at least a light-emitting layer. The light-emitting layer may comprise organic light-emitting materials known in the art. Further, the organic light-emitting materials may include a host material and an object material.

It can be understood that the organic thin film layer 220 also includes other functional layer, for example, electron injection layer, electron transferring layer, hole barrier layer, electron barrier layer, hole transferring layer, hole injection layer, etc. All of the functional layers may be made of materials known in the art.

The present application also provides a display device, which includes any display panel of the present application.

The display device of the present application adopts the display panel of the present application, that is, it includes the TFT array substrate of the present application, thus the phenomenon of residual shadow is weak and the display uniformity is good.

Examples of the display devices may be mobile phones, tablet computers, intelligent learning machines, etc.

FIG. 10 shows a display device 2 as an example. The display device may be a mobile phone.

Next, the TFT array substrate of the present application will be further described in combination with specific embodiments.

Embodiment 1

An OLED display panel comprises a TFT array substrate and an organic light-emitting display module located on the TFT array substrate. The organic light-emitting display module comprises a cathode layer, an electron injection layer, an electron transferring layer, a hole barrier layer, a light-emitting layer, an electron barrier layer, a hole transferring layer, a hole injection layer, an anode layer and a cap layer in sequence. The TFT array substrate includes a substrate, a buffer layer, a semiconductor layer (P—Si layer), a gate insulating layer, a gate layer, an internal insulating layer and a source-drain layer stacked in sequence. The semiconductor layer includes a source region, a drain region and a channel region located between the source region and the drain region. The surface layer of the channel region close to the gate layer is doped with $BF_2$, and the doping depth is 10 nm. The gate layer includes a gate, which is arranged corresponding to the channel region. The source-drain layer includes a source and a drain separated from each other. The source is electrically connected to the source region, and the drain is electrically connected to the drain region. Wherein the energy of the ion implantation of doping $BF_2$ is 10 KeV and the dose of the ion implantation is $8\times10^{11}$ cm$^{-2}$. The TFT array substrate also includes a storage capacitor.

Comparative Example 1

The Comparative Example 1 is similar to the display panel of the Embodiment 1, except that the p-type impurity in the channel region is B.

Figure 12:
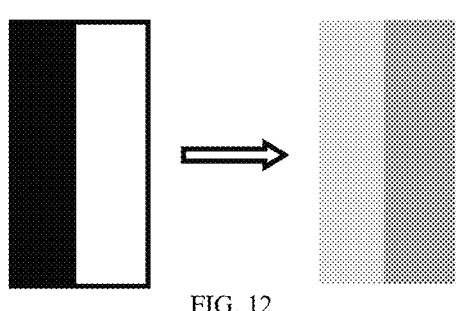
FIG. 12 is a schematic diagram of the display effect of the display panel of a comparative example 1.

The display effects of switching from different brightness pictures to the same gray scale in Embodiment 1 and Comparative Example 1 are shown in FIG. 11 and FIG. 12 respectively. As can be seen from FIG. 11, the TFT array substrate of the present application has a good display effect without obvious phenomenon of residual shadow. As can be seen from FIG. 12, there is an obvious phenomenon of residual shadow on the display panel of the Comparative Example 1.

The description above is only the specific embodiments of this application, but the protection scope of this application is not limited to this. Any skilled in the art can easily think of various equivalent modifications or replacements within the technical scope disclosed in this application, and these modifications or replacements should be covered by the protection scope of this application. Therefore, the scope of protection of this application shall be subject to the protection scope of the claims.

What is claimed is:

1. A thin film transistor array substrate comprising a semiconductor layer, a gate layer and a source-drain layer arranged in a stacked manner, two insulating layers respectively located between the semiconductor layer and the gate layer and between the gate layer and the source-drain layer, wherein the semiconductor layer comprises a source region, a drain region and a channel region located between the source region and the drain region, the channel region is doped with a p-type impurity having a molecular weight equal to or greater than 25, a range of a doping depth of the p-type impurity in the channel region is 5 nm to 10 nm, a surface layer of the channel region close to the gate layer is doped with the p-type impurity, and a range of a doping concentration per the doping depth of the p-type impurity in the channel region is $3\times10^{11}$ $cm^{-2}$ to $2\times10^{12}$ $cm^{-2}$, the gate layer comprises a gate arranged corresponding to the channel region, the source-drain layer comprises a source and a drain separated from each other, the source is electrically connected to the source region, and the drain is electrically connected to the drain region, the source region and the drain region have undergone two ion implantation processes, and the channel region has undergone one ion implantation processes, a range of a doping concentration of the p-type impurity in the source region and the drain region is $5\times10^{14}$ $cm^{-2}$ to $2\times10^{15}$ $cm^{-2}$.

2. The thin film transistor array substrate of claim 1, wherein a range of the molecular weight of the p-type impurity is 25 to 200.

3. The thin film transistor array substrate of claim 1, wherein the p-type impurity is selected from indium, BF and $BF_2$.

4. The thin film transistor array substrate of claim 1, wherein the p-type impurity comprises $BF_2$.

5. The thin film transistor array substrate of claim 1, wherein the semiconductor layer is a polysilicon film layer and a range of a hydrogen content of the polysilicon film layer is 0.01% to 3%.

6. The thin film transistor array substrate of claim 5, wherein a range of a particle size of polysilicon in the polysilicon film layer is 0.2 $\mu$m to 0.4 $\mu$m.

7. The thin film transistor array substrate of claim 1, wherein a range of a thickness of the channel region is 40 nm to 55 nm.

8. The thin film transistor array substrate of claim 1, wherein the thin film transistor array substrate comprises the semiconductor layer, a gate insulating layer, the gate layer, an internal insulating layer and the source-drain layer stacked in sequence.

9. The thin film transistor array substrate of claim 8, wherein the thin film transistor array substrate comprises a top gate thin film transistor.

10. The thin film transistor array substrate of claim 8, wherein the gate insulating layer comprises one or more of silicon oxide, silicon nitride and silicon-based nitrogen oxide.

11. The thin film transistor array substrate of claim 1, wherein a range of a doping concentration per the doping depth of the p-type impurity in the channel region is $5\times10^{11}$ $cm^{-2}$ to $1\times10^{12}$ $cm^{-2}$.

12. The thin film transistor array substrate of claim 5, wherein a range of a hydrogen content of the polysilicon film layer is 0.01% to 2%.

13. The thin film transistor array substrate of claim 1, wherein a doping concentration per the doping depth of the p-type impurity in the channel region is $3\times10^{11}$ $cm^{-2}$, a range of a hydrogen content of the polysilicon film layer is 1.5% to 3%, and a range of a particle size of polysilicon in the polysilicon film layer is 0.2 $\mu$m to 0.3 $\mu$m.

* * * * *